United States Patent
Song et al.

(10) Patent No.: US 7,859,924 B2
(45) Date of Patent: Dec. 28, 2010

(54) APPARATUS FOR CONTROLLING TEST MODE OF SEMICONDUCTOR MEMORY

(75) Inventors: Seong Hwi Song, Gyeonggi-do (KR); Sun Hye Shin, Gyeonggi-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 377 days.

(21) Appl. No.: 11/643,917

(22) Filed: Dec. 22, 2006

(65) Prior Publication Data
US 2007/0211546 A1    Sep. 13, 2007

(30) Foreign Application Priority Data
Mar. 7, 2006   (KR) .................. 10-2006-0021234

(51) Int. Cl.
*G11C 29/00* (2006.01)
(52) U.S. Cl. .............. 365/201; 365/230.03; 365/189.02
(58) Field of Classification Search .................. 365/201, 365/185.11, 230.03, 230.04, 195
See application file for complete search history.

(56) References Cited

U.S. PATENT DOCUMENTS

| | | | |
|---|---|---|---|
| 5,511,029 A * | 4/1996 | Sawada et al. .............. 365/201 |
| 5,959,911 A * | 9/1999 | Krause et al. ............... 365/201 |
| 5,959,930 A * | 9/1999 | Sakurai .................. 365/230.03 |
| 6,076,136 A * | 6/2000 | Burroughs et al. ............. 711/5 |
| 6,094,337 A | 7/2000 | Ueda et al. |
| 6,175,528 B1 * | 1/2001 | Kye ........................... 365/200 |
| 6,430,101 B1 * | 8/2002 | Toda ..................... 365/225.7 |
| 7,002,364 B2 | 2/2006 | Kang et al. |
| 2002/0051401 A1 * | 5/2002 | Lee ....................... 365/230.03 |
| 2005/0195666 A1 * | 9/2005 | Hong et al. .................. 365/201 |
| 2007/0014168 A1 * | 1/2007 | Rajan ......................... 365/201 |

FOREIGN PATENT DOCUMENTS

| | | |
|---|---|---|
| JP | 2004178672 | 6/2004 |
| KR | 1019990077482 | 10/1999 |
| KR | 1020050094113 | 9/2005 |

* cited by examiner

*Primary Examiner*—Tuan T Nguyen
*Assistant Examiner*—R Lance Reidlinger
(74) *Attorney, Agent, or Firm*—Venable LLP; Jeffri A. Kaminski

(57) ABSTRACT

Disclosed is a test mode control apparatus of a semiconductor memory having a plurality of banks divided into first and second bank groups, a plurality of pads, and a test mode controller. The test mode controller outputs data to the pads from one of the first and second bank groups and then outputs data to the pads from the other of the first and second bank groups.

20 Claims, 5 Drawing Sheets

APPARATUS FOR CONTROLLING TEST MODE OF SEMICONDUCTOR MEMORY

CROSS-REFERENCE TO RELATED APPLICATIONS

This U.S. non-provisional patent application claims priority under 35 U.S.C. §119 of Korean Patent Application No. 2006-0021234 filed on Mar. 7, 2006, the entire contents of which are hereby incorporated by reference.

BACKGROUND

The present invention disclosed herein relates to semiconductor memories and more particularly, to an apparatus and method for controlling a test mode of a semiconductor memory.

With an increase of memory capacity, a general semiconductor memory usually employs multi-bank architecture with 2, 4, or 8 banks to efficiently control its entire memory area.

In a conventional semiconductor memory, a normal operation mode only operates with one of the banks, but a test mode (e.g., a parallel test mode) is operable with all of the banks arranged therein and by test apparatus connected thereto.

For example, a semiconductor memory with a 4-bank architecture, as shown in FIG. 1, includes first through fourth banks BK0-BK3, and eight pads 20 from 0 to 7 in numeric order. Two pads 20 are allocated to each of the first through fourth banks BK0-BK3 as shown in FIG. 1.

Such a semiconductor memory, structured as illustrated in FIG. 1, is put into a test operation on test apparatus (not shown), as follows.

The test apparatus first inputs a predetermined address into semiconductor memory for conducting the test mode.

The semiconductor memory sets its operation mode as the test mode by decoding the address.

In this case of setting the test mode, the semiconductor memory activates all of the first through fourth banks BK0-BK3 to output data by way of the pads 20.

Namely, as shown in FIG. 2, even and odd data, Q0/Q2 and Q1/Q3, are sequentially output by the pads 20 allocated to each of the banks BK0-BK3.

Thereby, the test apparatus tests the operational state of the semiconductor memory with the data output through the pads 20.

On the other hand, a semiconductor memory with an 8-bank architecture, as shown in FIG. 3, includes first through eighth banks BK0-BK7 and 16 pads 30.

In the semiconductor memory with the 8-bank architecture, a test mode is carried out for the first group of four banks BK0-BK3 using the first through seventh pads (0-7 or 8-15 in numeric order) and next for the second group of four banks BK4-BK7 using the unit of the eight pads (0-7 or 8-15 in numeric order).

However, such conventional test schemes have the disadvantages outlined as follows.

First, since the plurality of banks are adjacent to each other and activated at the same time during the test mode, it causes many fluctuations different from a practical operation of the semiconductor memory, such as noises due to a rapid increase of power consumption. This creates data output errors thereby preventing a reliable test operation from taking place.

Second, as pads in a separate location are used in the semiconductor memory with the 8-bank architecture during the test mode, complex hardware and software configurations in the test equipment, as well as modifications to the hardware and software structure therein are required.

SUMMARY

Embodiments of the present invention provide an apparatus and method for controlling a test mode of a semiconductor memory, which can offer stability and simplicity in testing a semiconductor memory.

According to a first embodiment of the present invention, a test mode control apparatus of a semiconductor memory having a plurality of banks divided into a first and a second bank group includes a plurality of pads and a test mode controller. The test mode controller being configured to first output data to the pads from one of the first and second bank groups and then to output data to the pads from the other of the first and second bank groups in response to a control signal.

According to a second embodiment of the present invention, a test mode control apparatus of a semiconductor memory having a plurality of banks divided into even and odd bank groups includes a plurality of pads and a test mode controller. The test mode controller being configured to first output data to the pads from one of the even and odd bank groups and then to output data to the pads from the other of the first and second bank groups in response to a control signal.

Further, according to a third embodiment of the present invention, a method for controlling a test mode of a semiconductor memory having a plurality of banks includes: activating the banks of a first bank group, which are arranged without being adjacent to each other, in order to output data corresponding to a predetermined address when a test mode is enabled; and activating the banks of a second bank group, which excludes the first bank group, in order to output data corresponding to a predetermined address after outputting data from the first bank group.

According to a fourth embodiment of the present invention, a method for controlling a test mode of a semiconductor memory having a plurality of banks includes: activating the banks of one of even and odd bank groups, divided in a numeric order out of the plurality of banks, when a test mode is enabled, to output data corresponding to a predetermined address; and activating the banks of the other of the even and odd bank groups to output data corresponding to a predetermined address after outputting data from the first bank group.

A further understanding of the nature and advantages of the present invention herein may be realized by reference to the remaining portions of the specification and the attached drawings.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified. In the figures.

DESCRIPTION OF EXEMPLARY EMBODIMENTS

Figure 1:
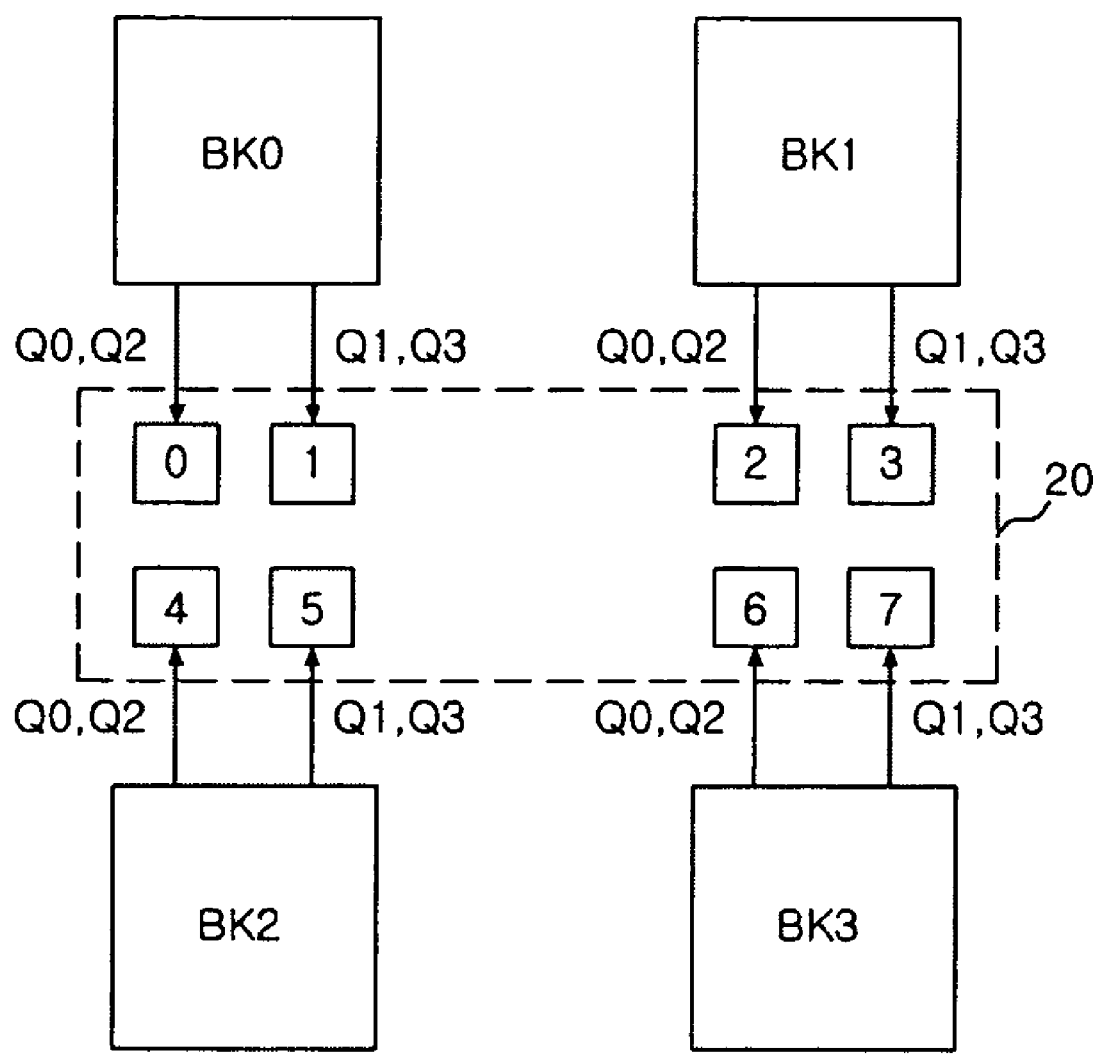
FIG. 1 is a block diagram showing a semiconductor memory with a 4-bank architecture as in the a conventional art.
Figure 2:
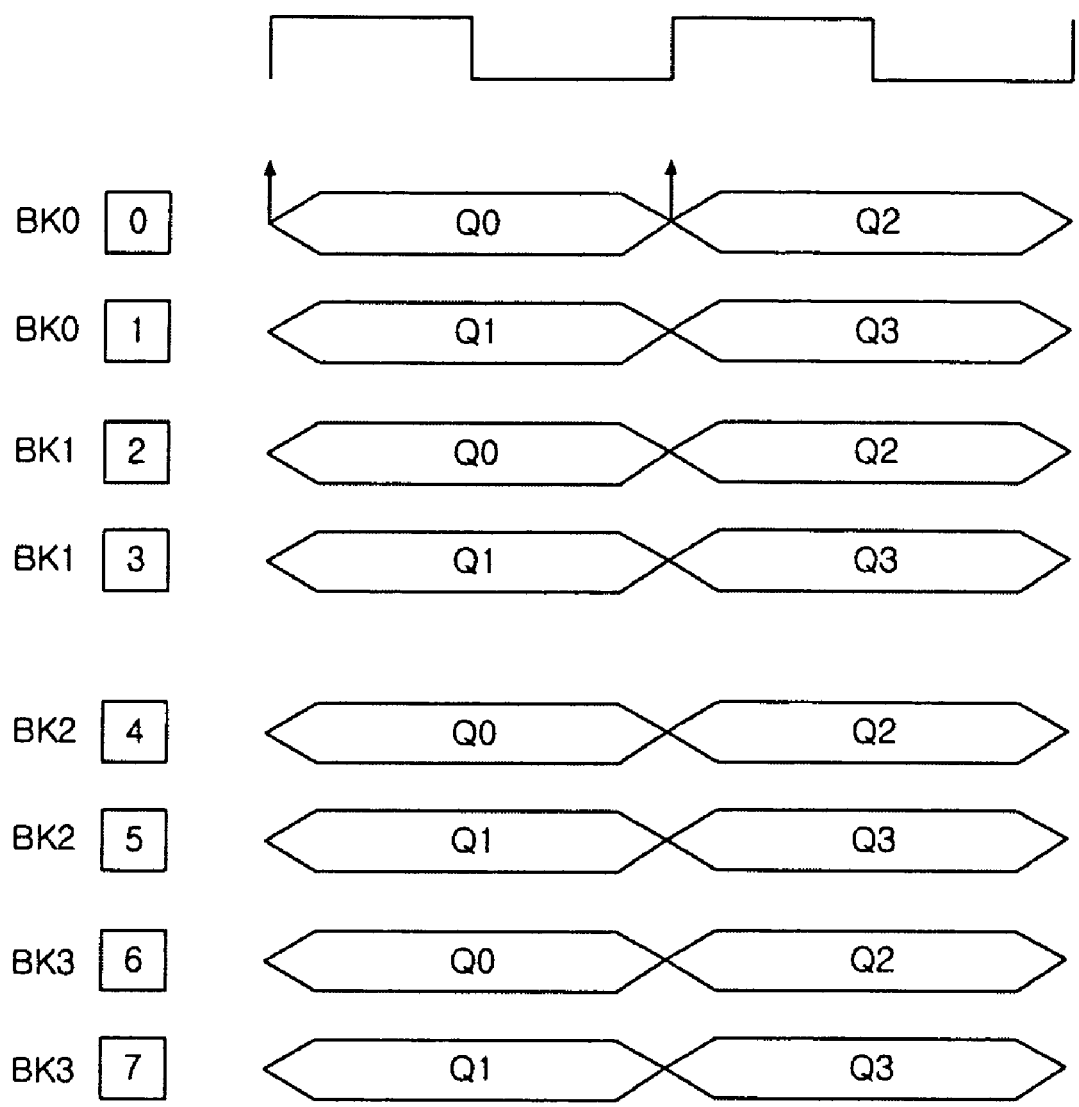
FIG. 2 is a timing diagram showing a method for controlling a test mode in a conventional semiconductor memory.
Figure 3:
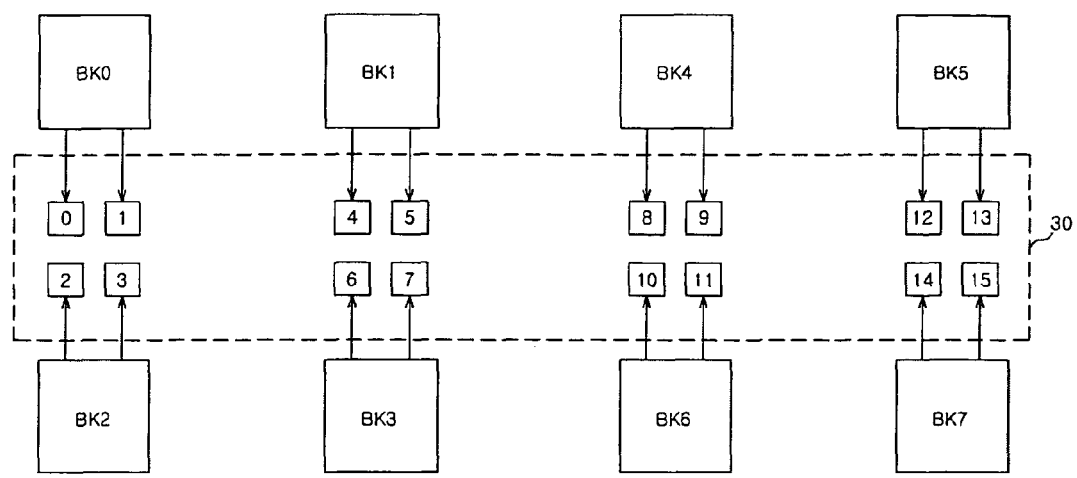
FIG. 3 is a block diagram showing a semiconductor memory with an 8-bank architecture as in the conventional art.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

Figure 4:
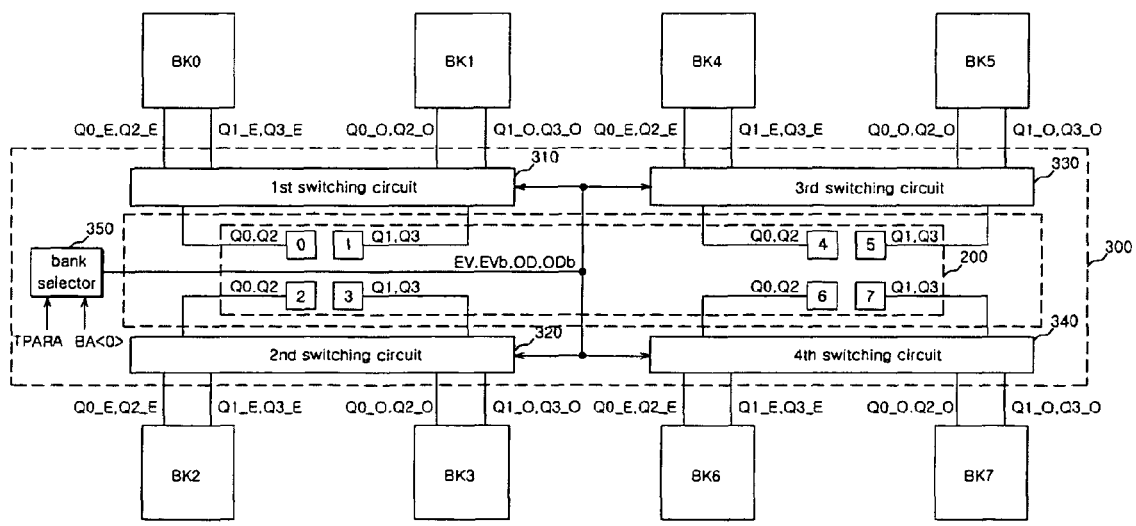
FIG. 4 is a block diagram illustrating an apparatus for controlling a test mode in a semiconductor memory in accordance with an embodiment of the present invention.
Figure 5:
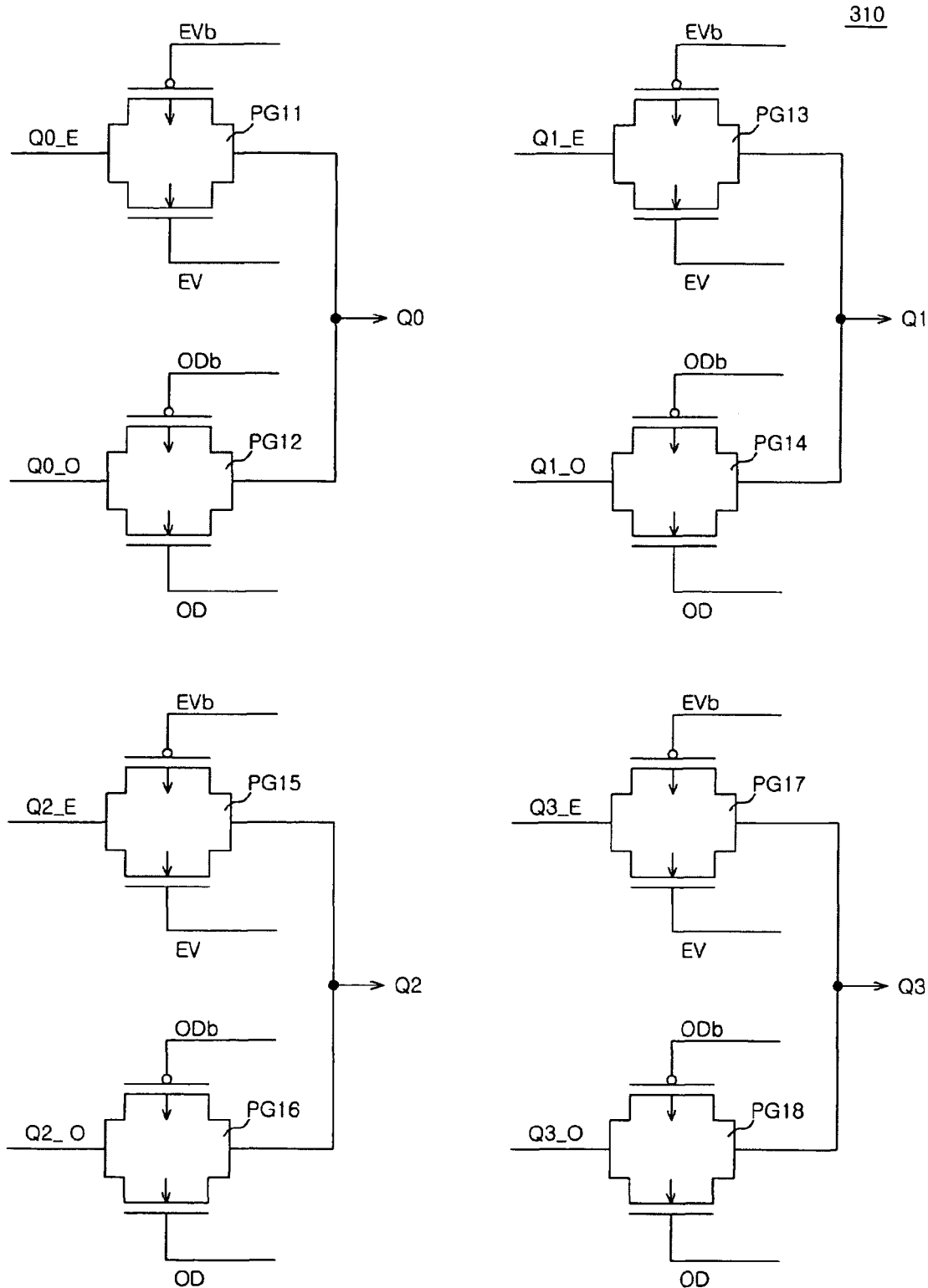
FIG. 5 is a circuit diagram of the internal features of the first switching circuit shown in FIG. 4.
Figure 6:
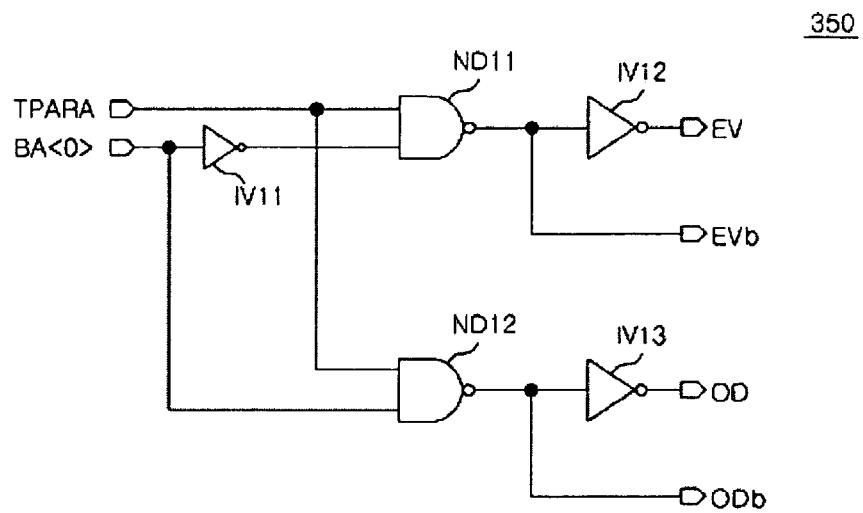
FIG. 6 is a circuit diagram of the internal structure of the bank selector shown in FIG. 5.
Figure 7:
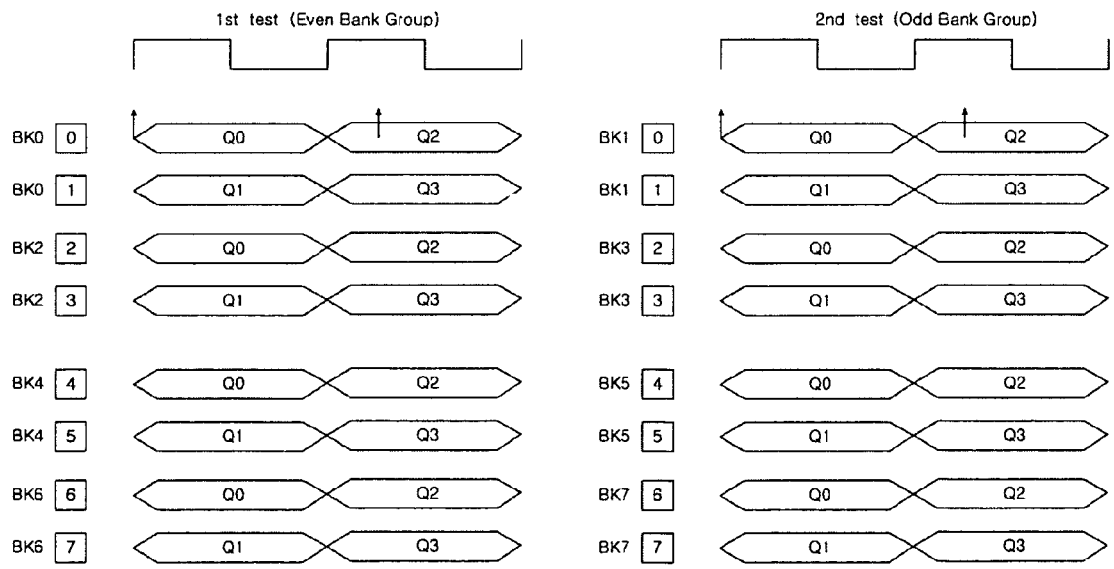
FIG. 7 is a timing diagram showing a method for controlling a test mode of a semiconductor memory according to an embodiment of the present invention.

FIG. 4 is a block diagram illustrating an apparatus for controlling a test mode in a semiconductor memory in accordance with an embodiment of the present invention, and FIG. 5 is a circuit diagram of the internal features of the first switching block shown in FIG. 4. FIG. 6 is a circuit diagram of the internal structure of the bank selector shown in FIG. 5, and FIG. 7 is a timing diagram showing a method for controlling a test mode of a semiconductor memory according to the present invention.

An embodiment for an apparatus for controlling a test mode of a semiconductor memory (hereinafter, referred to as 'test mode control apparatus') according to the present invention is applied to a semiconductor memory organized with an eight bank architecture, as illustrated in FIG. 4.

Referring to FIG. 4, the test mode control apparatus of the present invention includes: first through eighth banks BK0-BK7, classified into first and second bank groups; a plurality of pads 200; and a test mode controller 300. The test mode controller 300 outputs data from one of the first and second bank groups in a first test period, and then outputs data from the other of the first and second bank groups in a second test period, in response to control signals TPARA and BA<0>.

Here, TPARA is a test mode signal and BA<0> is a part of a bank address.

The test operation for the eight banks BK0-BK7 of embodiments of the present invention is carried out through a first test period and a second test period. The banks simultaneously operating in each of the first and second test periods correspond to the first and second bank groups.

Further, in order to prevent data output errors caused by adjacent banks that are activated at the same time, the first and second bank groups are arranged such that the banks thereof are not adjacent to each other. In other words, as shown in FIG. 4, it is preferred to divide the banks into even and odd numbers where the eight banks BK0-BK7 are arranged so they are separated from each other as much as possible.

Accordingly, the first bank group may be arranged as an even bank group including the even-numbered banks ("even bank group") BK0, BK2, BK4, and BK6, and the second bank group may be arranged as an odd bank group including the odd-numbered banks ("odd bank group") BK1, BK3, BK5, and BK7. It is also possible to reverse the first and second bank groups. Hereinafter, the first bank group is referred as the even bank group including BK0, BK2, BK4, and BK6 (BK0 BK6) while the second bank group is referred to as the odd bank group including BK1, BK3, BK5, and BK7 (BK1 BK7).

The test mode controller 300, as shown in FIG. 4, includes first through fourth switching circuits 310-340 and a bank selector 350. The first through fourth switching circuits 310-340 are connected to the adjacent even and odd banks in the even and odd bank groups and they select and output data from one of the banks to the pads 200 in response to switching signals EV, EVb, OD, and ODb. The bank selector 350 outputs the switching signals EV, EVb, OD, and ODb to select data from one of the even and odd bank groups in response to the control signals TPARA and BA<0>.

The first through fourth switching circuits 310-340 are identical to each other in structure. As an example, referring to FIG. 5, the first switching circuit 310 includes pass gates PG11-PG18 arranged according to the data output from its corresponding even and odd banks BK0 and BK1. The pass gates receiving data in the same order are coupled together at their common output terminal. Namely, the pass gates PG11 and PG12 receiving data Q0_E and Q0_O are commonly coupled at their output terminal. The pass gates PG13 and PG14 receiving data Q1_E and Q1_O are commonly coupled at their output terminal. The pass gates PG15 and PG16 receiving data Q2_E and Q2_O are commonly coupled at their output terminal. The pass gates PG17 and PG18 receiving data Q3_E and Q3_O are commonly coupled at their output terminal.

The pass gates, PG11, PG13, PG15, and PG17, receiving data output from the even bank group and respond to the switching signals EVb and EV, respectively, through their first and second control nodes. The pass gates, PG12, PG14, PG16, and PG18, receiving data output from the odd bank group and respond to the switching signals ODb and OD, respectively, through their first and second control nodes.

The bank selector 350, as illustrated in FIG. 6, includes a first inverter IV11 that receives BA<0>, a first NAND gate ND 11 that outputs the switching signal EVb from an output of the first inverter IV11 and the test mode signal TPARA, a second inverter IV12 that outputs the switching signal EV from the output EVb of the first NAND gate ND11, a second NAND gate ND12 that outputs the switching signal ODb from BA<0> and TPARA, and a third inverter IV13 that outputs the switching signal OD from the output ODb of the second NAND gate ND12.

An operation of the test mode control apparatus with the aforementioned structure will now be described.

A test mode according to the embodiment of present invention is divided into a first and a second test. Namely, after completing the first test on the even bank group, the second test is carried out on the odd bank group.

Accordingly, the test apparatus inputs a predetermined address into the semiconductor memory for conducting the first test mode. The semiconductor memory decodes the address and outputs the control signals TPARA and BA<0> to the bank selector 350.

During this, the test mode signal TPARA is set to high level ('1') when the test mode is enabled and set to low level ('0') when the test mode is disabled. BA<0> is set to low level ('0')_when an even bank is enabled and set to high level ('1') when an odd bank is enabled. The first test is carried out when TPARA=1 and BA<0>=0, while the second test is carried out when TPARA 1 and BA<0>=1.

Thus, when TPARA=1 and BA<0>=0 the semiconductor memory sets its operation mode to the test mode and activates all the banks of the even bank group to enable data output operations therefrom for the first test.

The bank selector 350 shown in FIG. 6 generates and outputs the switching signals EV=1, EVb=0, OD=0, and ODb=1 to the first through fourth switching circuits 310-340 while TPARA=1 and BA<0>=0 according to the first test.

In the first through fourth switching circuits 310-346 shown in FIG. 5, when EV=1, EVb=0, OD=0, and ODb=1, the pass gates PG11, PG13, PG15, and PG17 are turned on to receive the data Q0_E, Q1_E, Q2_E, and Q3_E from the even bank group. Then, data Q0-Q3 are output to the test equipment through the pads 200 as shown in FIG. 7. Thus, the test equipment conducts the first test for the even bank group by means of the output data Q0-Q3.

After the first test, the test apparatus inputs a predetermined address into the semiconductor memory for conducting the second test. The semiconductor memory decodes the address and outputs the control signals TPARA and BA<0> to the bank selector 350.

During the second test, the test mode signal TPARA is set to 1 and BA<0> is set to 1. Thus, the semiconductor memory activates all the banks of the odd bank group to enable data output operations therefrom for the second test mode. The bank selector 350 shown in FIG. 6 generates and outputs the switching signals EV=0, EVb=1, OD=1, and ODb=0 to the first through fourth switching circuits 310-340 when TPARA=1 and BA<0>=1 according to the second test.

In the first through fourth switching circuits 310-340 shown in FIG. 5, when EV=0, EVb=1, OD=1, and ODb=0, the pass gates PG12, PG14, PG16, and PG18 are turned on to receive the data Q0_O, Q1_O, Q2_O, and Q3_O from the odd bank group. Then, data Q0-Q3 are output to the test equipment through the pads 200 as shown in FIG. 7. Thus, the test apparatus conducts the second test for the odd bank group using the output data Q0-Q3.

According to the aforementioned features, the test mode control apparatus and method of embodiments of the present invention offer the following advantageous effects.

First, because the test mode outputs data by simultaneously activating banks that are not adjacent to each other, the test operation activation pattern is similar to a normal operation. Thus, it is able to enhance test reliability.

Second, since the test mode operates with pads at the same location, it simplifies the hardware and software configurations required for the test mode and hence improves test efficiency.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A test mode control apparatus of a semiconductor memory having a plurality of banks divided into a first and second bank group, comprising:
 a bank selector configured to enable one of a first switching signal and a second switching signal in response to a specific bank address when a test mode signal is enabled, and disable both the first switching signal and the second switching signal when the test mode signal is disabled;
 a plurality of first switches configured to output data from banks included in the first bank group in response to the first switching signal; and
 a plurality of second switches configured to output data from banks included in the second bank group in response to the second switching signal,
 wherein each of output terminals of the first switches and each of output terminals of the second switches corresponding to the first switches are connected in common to each of a plurality of pads.

2. The test mode control apparatus as set forth in claim 1, wherein the bank selector comprises:
 a first inverter configured to receive the specific bank address;
 a first NAND gate configured to receive the test mode signal and a output signal of the first inverter;
 a second inverter configured to receive a output signal of the first NAND gate, and output the first switching signal;
 a second NAND gate configured to receive the test mode signal and the specific bank address; and
 a third inverter configured to receive a output signal of the second NAND gate, and output the second switching signal.

3. A test mode control apparatus of a semiconductor memory having a plurality of banks divided into a first and a second bank group, comprising:
 a plurality of pads; and
 a test mode controller configured to select data by selecting one of data outputted from the first bank group and data outputted from the second bank group to the pads, and to output data outputted from the other bank group excluding the bank group outputting the selected data to the pads after outputting the selected data, in response to a control signal,
 wherein the control signal includes a specific bank address of bank addresses as a first control signal and a test mode signal as a second control signal, and the test mode controller performs an operation of selecting and outputting data in response to the specific bank address when the test mode signal is enabled, and stops the operation of selecting and outputting data when the test mode signal is disabled, wherein the test mode controller comprises:
 a plurality of switching circuits configured to be connected to one bank of the first bank group and one bank of the second bank group each and to select and output data from one of the two banks to a corresponding pad in response to a switching signal; and
 a bank selector configured to generate the switching signal to select the data from the one bank of the first bank group and the one bank of the second bank group, which are connected to one of the switching circuits, in response to the control signal, wherein the bank selector comprises:
 a first inverter configured to receive the first control signal and produce an output;
 a first NAND gate configured to output an inverted first switching signal from the output of the first inverter and the second control signal;
 a second inverter configured to output a first switching signal from an output of the first NAND gate;
 a second NAND gate configured to output an inverted second switching signal from the first and second control signals; and
 a third inverter configured to output the second switching signal from an output of the second NAND gate.

4. The test mode control apparatus as set forth in claim 1, wherein a number of pads is the same as a total number of banks included in the first and second bank groups.

5. The test mode control apparatus as set forth in claim 1, wherein data of a bank pair adjacently arranged in the first and second bank groups are output through a same pad among the plurality of pads.

6. The test mode control apparatus as set forth in claim 1, wherein the banks of the first and the second bank groups are separated by a predetermined distance.

7. The test mode control apparatus as set forth in claim 1, wherein the first bank group is comprised of either even or odd banks in a numeric order from 0 to N.

8. The test mode control apparatus as set forth in claim 1, wherein the second bank group is comprised of either even or odd banks in a numeric order from 0 to N.

9. The test mode control apparatus as set forth in claim 1, wherein the one bank of the first bank group and the one bank of the second bank group connected to the plurality of switching circuits are adjacent to each other.

10. The test mode control apparatus as set forth in claim 1, wherein a number of the switching circuits is half of a total number of the banks.

11. The test mode control apparatus as set forth in claim 1, wherein the switching circuits comprise a plurality of pass gates configured to receive and output data from the one bank of the first bank group and the one bank of the second bank group in response to the switching signal.

12. The test mode control apparatus as set forth in claim 11, wherein the outputs of the pass gates configured to receive data in the same order are coupled in common.

13. The test mode control apparatus as set forth in claim 1, wherein the first switching signal and the inverted first switching signal are provided to enable the plurality of switching circuits to output data from the banks included in the first bank group.

14. The test mode control apparatus as set forth in claim 1, wherein the second switching signal and the inverted second switching signal are provided to enable the plurality of switching circuits to output data from the banks included in the second bank group.

15. A test mode control apparatus of a semiconductor memory having a plurality of banks divided into an even and an odd bank group, in numeric order, comprising:
a plurality of pads; and
a test mode controller configured to output selected data by selecting one of data outputted from the even bank group and data outputted from the odd bank group to the pads, and to output data outputted from the other bank group excluding the bank group outputting the selected data to the pads after outputting the selected data, in response to a control signal, wherein the test mode controller comprises:
a plurality of switching circuits configured to be connected to one bank of the even bank group and one bank of the odd bank group each and select and output data from one of the one bank of the even bank group and the one bank of the odd bank group to the corresponding pad in response to a switching signal; and
a bank selector configured to generate the switching signal to select the data from the one bank of the even bank group and the one bank of the odd bank group which are connected to one of the plural switching circuits, in response to the control signal, wherein the bank selector comprises:
a first inverter configured to receive the first control signal and produce an output;
a first NAND gate configured to output an inverted first switching signal from the output of the first inverter and the second control signal;
a second inverter configured to output a first switching signal from an output of the first NAND gate;
a second NAND gate configured to output an inverted second switching signal from the first and second control signals; and
a third inverter configured to output the second switching signal from an output of the second NAND gate,
wherein the control signal includes a specific bank address of bank addresses as a first control signal and a test mode signal as a second control signal, and the test mode controller performs an operation of selecting and outputting data in response to the specific bank address when the test mode signal is enabled, and stops the operation of selecting and outputting data when the test mode signal is disabled.

16. The test mode control apparatus as set forth in claim 15, wherein the number of pads is the same as the total number of banks included in the even and odd bank groups.

17. The test mode control apparatus as set forth in claim 15, wherein the data of a bank pair adjacently arranged in the even and odd bank groups are output through a same pad among the plurality of pads.

18. The test mode control apparatus as set forth in claim 15, wherein the switching circuits comprise a plurality of pass gates configured to receive and output data from the one bank of the even bank group and the one bank of the odd bank group in response to the switching signal, and
wherein the outputs of the pass gates configured to receive data in the same order are coupled in common.

19. The test mode control apparatus as set forth in claim 15, wherein the first switching signal and the inverted first switching signal are provided to enable the plurality of switching circuits to output data from the banks included in the even bank group.

20. The test mode control apparatus as set forth in claim 15, wherein the second switching signal and the inverted second switching signal are provided to enable the plurality of switching circuits to output data from the banks included in the odd bank group.

* * * * *

UNITED STATES PATENT AND TRADEMARK OFFICE
CERTIFICATE OF CORRECTION

| | | |
|---|---|---|
| PATENT NO. | : 7,859,924 B2 | Page 1 of 1 |
| APPLICATION NO. | : 11/643917 | |
| DATED | : December 28, 2010 | |
| INVENTOR(S) | : Song et al. | |

It is certified that error appears in the above-identified patent and that said Letters Patent is hereby corrected as shown below:

In the Claims:

In Claim 4, column 6, line 65, replace "claim 1" with --claim 3--.

In Claim 5, column 7, line 1, replace "claim 1" with --claim 3--.

In Claim 6, column 7, line 5, replace "claim 1" with --claim 3--.

In Claim 7, column 7, line 8, replace "claim 1" with --claim 3--.

In Claim 8, column 7, line 11, replace "claim 1" with --claim 3--.

In Claim 9, column 7, line 14, replace "claim 1" with --claim 3--.

In Claim 10, column 7, line 18, replace "claim 1" with --claim 3--.

In Claim 11, column 7, line 21, replace "claim 1" with --claim 3--.

In Claim 13, column 7, line 29, replace "claim 1" with --claim 3--.

In Claim 14, column 7, line 34, replace "claim 1" with --claim 3--.

Signed and Sealed this
Fifteenth Day of March, 2011

David J. Kappos
*Director of the United States Patent and Trademark Office*